United States Patent
Kim et al.

(10) Patent No.: US 6,518,745 B2
(45) Date of Patent: Feb. 11, 2003

(54) DEVICE TEST HANDLER AND METHOD FOR OPERATING THE SAME

(75) Inventors: Seong Bong Kim, Chungchongnam-do (KR); Yang Hee Kim, Chungchongnam-do (KR); Won Hee Jo, Chungchongnam-do (KR); Byoung Dae Lee, Chungchongnam-do (KR); Hyun Soo Oh, Chungchongnam-do (KR)

(73) Assignee: Mirae Corporation, Chonan-shi (KR)

( * ) Notice: Subject to any disclaimer, the term of this patent is extended or adjusted under 35 U.S.C. 154(b) by 0 days.

(21) Appl. No.: 09/805,214

(22) Filed: Mar. 14, 2001

(65) Prior Publication Data

US 2002/0041181 A1 Apr. 11, 2002

(51) Int. Cl.⁷ .............................................. G01R 31/02
(52) U.S. Cl. ..................... 324/158.1; 324/760; 414/225
(58) Field of Search .............................. 324/158.1, 760, 324/765; 414/404, 225; 209/573

(56) References Cited

U.S. PATENT DOCUMENTS

| | | | | |
|---|---|---|---|---|
| 5,290,134 A | * | 3/1994 | Baba | 294/65 |
| 5,650,732 A | * | 7/1997 | Sakai | 324/754 |
| 5,865,319 A | * | 2/1999 | Okuda et al. | 209/571 |
| 5,919,024 A | | 7/1999 | Fujimori | 414/225 |
| 6,036,431 A | | 3/2000 | Fujimori | 414/806 |

* cited by examiner

*Primary Examiner*—Michael Sherry
*Assistant Examiner*—Tung X. Nguyen
(74) *Attorney, Agent, or Firm*—Fleshner & Kim, LLP

(57) ABSTRACT

A device test handler and a method for operating the same provide a significant reduction of the picking up and placing time periods, and reduce possible damage to the devices being tested. Devices and methods embodying the invention facilitate room temperature and high temperature testing within one device test handler to maximize testing efficiency. A test handler embodying the invention may include a pre-heater for pre-heating the devices on a loading shuttle as the loading shuttle passes to a test chamber. An indexing device in a test chamber of the device is used for successively transferring the devices from a loading shuttle to the test socket, and tested devices from the test socket to an unloading shuttle. Heat supply means may be provided for supplying a high temperature heat to the test chamber when the devices are required to be tested in a hot state. An unloading part having a plurality of trays movably fitted on the base is used to transfer devices from an unloading shuttle to output trays based on the testing results.

35 Claims, 5 Drawing Sheets

DEVICE TEST HANDLER AND METHOD FOR OPERATING THE SAME

BACKGROUND OF THE INVENTION

1. Field of the Invention

The present invention relates to a device test handler, and more particularly, to a device test handler which facilitates room temperature as well as elevated or lower temperature testing of a logic device; and a method for operating the same.

2. Background of the Related Art

In general, a semiconductor device undergoes a test for inspection of defects after completion of fabrication on a production line. The device test handler is employed in testing various logic devices, such as QFP, BGA, PGA, SOP and the like, which are mostly non-memory semiconductor packages. During such testing, the device is placed in a tray which travels through the test machine. At some point, the logic device is tested at a test part. The logic devices are then unloaded onto trays after classifying the devices into different grades according to a result of the test. Different classifications of logic devices are loaded into different trays.

However, the related art device test handler has the following problems. First, the frequent pickup and placing of logic devices by the related art device test handler causes breakage to the expensive logic devices during testing, and also prolongs index times.

Second, the related art device test handler has a test part that temporarily holds the logic devices to be tested in test sockets for a time period until the testing is completed. There is an indexing device for automatic and continuous transportation and loading of the logic devices to be tested from input trays into the test socket, and for unloading the tested devices from the test socket to an unloading tray. However, the indexing device in the related art device test handler is quite complicated. For example, the indexing device disclosed in JP Laid Open Patent No. H10-82830 (Mar. 31, 1998) has a system in which two contact hands reciprocate in two directions for loading and unloading the logic devices in succession. This system was intended to reduce the index time compared to other indexing devices without increasing a number of components of the indexing device. However, this indexing device, which transports the logic devices in both directions, requires a separate device for continuous and simultaneous placing and picking up of the logic devices to/from two stages loaded on shuttles on both sides of the indexing device. As a result, the whole system of the related art device test handler becomes complicated because the separate device is very complicated and difficult to operate.

SUMMARY OF THE INVENTION

Accordingly, the present invention is directed to a device test handler and a method for operating the same that substantially obviates one or more of the problems, limitations and disadvantages of the related art.

An object of the present invention is to provide a device test handler, which can conduct room temperature or elevated temperature testing, and a method for operating the same, which can reduce frequent picking and placing of logic devices. As a result, damage to the logic devices is minimized, and an index time is reduced.

Another object of the present invention is to provide an indexing device for a device test handler, which is simple, and which can minimize an index time and make device testing easy without provision of a separate device placing/picking up device.

Additional features and advantages of the invention will be set forth in the description which follows, and in part will be apparent from the description which follows, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a device test handler embodying the invention includes a loading part movably fitted on a base of the device test handler. The loading part moves trays in forward and backward directions, each of the trays having logic devices to be tested placed therein. Multiple loading shuttles are movably fitted on the base for transferring the logic devices through the test handler. A pre-heating part may be used for pre-heating the logic devices on the shuttles as the shuttles pass therethrough when it is required to test the logic devices at an elevated temperature. The test handler includes a test chamber having one or more test sockets, each of which is configured to receive, hold, and test the logic devices. An indexing device of the test handler is configured for successive transferring of the logic devices from one of the loading shuttles into the test socket, and for transferring the tested logic devices from the test socket to one of the unloading shuttles. A heat supply means of the test handler is used for supplying a high temperature heat to the test socket when the devices must be tested in a hot state. The logic devices are classified according to a result of the test. A transporting device of the test handler is used for transferring the logic devices from trays in the loading part to one of the shuttles, and for transferring the devices from one of the shuttles, after testing, into trays or an unloading part. The logic devices are placed in different trays of the unloading part by the transporting device depending on their classification.

A device test handler embodying the invention may further includes a buffer part for temporary storage of logic devices determined to be defective before transferring the logic devices to the unloading part.

The transporting device includes a guide frame fitted to cross over the base of the device test handler. A loading picker is movably fitted at one side of the guide frame and is configured to move along the guide frame. The loading picker is used to transfer logic devices to be tested from input trays in the loading part onto a loading shuttle. A first unloading picker is also movably fitted to the guide frame to move along the guide frame. The first unloading picker transfers the tested logic devices from an unloading shuttle onto respective trays in an unloading part, and onto a buffer part. A second unloading picker is also movably fitted to the guide frame to move along the guide frame. The second unloading picker is used to transfer logic devices from the buffer part to a defective device tray in the unloading part.

The pre-heating part includes a heating plate for heating the loading shuttles while the loading shuttles are placed and carried thereon. Because the logic devices can be preheated as the shuttles move along the heating plate, there is no need to pick and place the devices into a preheating chamber. Thus, a test handler embodying the invention reduces device picking up and placing times compared to prior art devices, and facilitates room temperature and high temperature testing.

The unloading part includes a plurality of good device trays for holding logic devices determined by the test to be good devices. The unloading part also includes a plurality of retest device trays for holding logic devices classified for retesting, and a plurality of defective device trays for holding logic devices classified as defective.

The device test handler further includes a loading shuttle direct transporting device for transporting a loading shuttle directly to the test chamber without forcing the loading shuttle to pass through the pre-heating part. This can occur when the logic devices are to be tested at room temperature. The loading shuttle direct transporting device allows testing to be carried out more efficiently as a moving path of the loading shuttle becomes shorter when the devices are to be at room temperature.

The device test handler further includes a tray distributing device for distributing empty trays from the loading part to the unloading part after all the logic devices are transferred from the input trays. The tray distributing device simplifies operations and reduces the need for operator action, as empty trays can be re-circulated on the device test handler.

The indexing device in the testing part includes a pair of opposing frames fitted to crossover the loading shuttle, the test socket and the unloading shuttle. A first index head and a second index head are movably fitted in parallel to the frames for alternately repeating a process of transferring logic devices from a loading shuttle to the test sockets, loading the devices into the sockets, and transferring the devices from the test sockets to an unloading shuttle. A first driving means and second driving means are provided for respectively moving the first index head and the second index head in a rotational manner along the frames. First vertical driving means and second vertical driving means are provided for respectively moving the first index head and the second index head in up and down directions.

Each of the first driving means and second driving means includes a motor fitted to one side of the frame. A threaded driving rod is rotatably fitted in parallel to the frame and is configured to rotate as the motor is driven. A supporting block thread is coupled to the threaded driving rod for moving along the threaded driving rod as the threaded driving rod rotates. A guide member is coupled to the supporting block in parallel to the threaded driving rod for guiding a movement of the supporting block as the supporting block is moved by the threaded driving rod.

Each of the first vertical driving means and second vertical driving means includes a vertical motor, and a threaded vertical driving rod coupled to the vertical motor. An elevating member is coupled to the threaded vertical driving rod for moving up and down as the threaded vertical driving rod rotates. A supporting member is coupled to the elevating member, and a front portion the first index head or the second index head is fitted thereto. A guide member is coupled to the supporting member for guiding a vertical movement of the supporting member as the supporting member is moved by the threaded vertical driving rod.

A method for operating a device test handler embodying the invention includes the steps of: (1) loading a tray having devices to be tested on a loading part; (2) transporting the devices loaded on the loading part, by means of a loading picker, into a loading shuttle; (3) pre-heating the devices on the loading shuttle as the loading shuttle passes through a pre-heating part; (4) transporting the loading shuttle, after it has passed through the pre-heating part, to a test chamber; (5) loading the devices on the loading shuttle in the test chamber into one or more test sockets, by means of the indexing device, testing the logic devices, and unloading the devices from the test sockets to an unloading shuttle; (6) classifying the tested devices on the unloading shuttle according to a result of the testing; (7) transferring the tested devices determined good or to be retested into trays for the good devices or the devices to be retested by means of a first unloading picker; (8) transferring and temporarily storing the devices determined defective on a buffer part, and (9) transferring the devices from the buffer part to the tray for defective devices in the unloading part by means of a second unloading picker.

If the devices are to be tested at room temperature, a method embodying the invention could eliminate step (3) so that the loading shuttle is transported to the test chamber directly by means of a direct transporting device without passing through the pre-heating part after the devices are loaded on the loading shuttle.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

Figure 1:
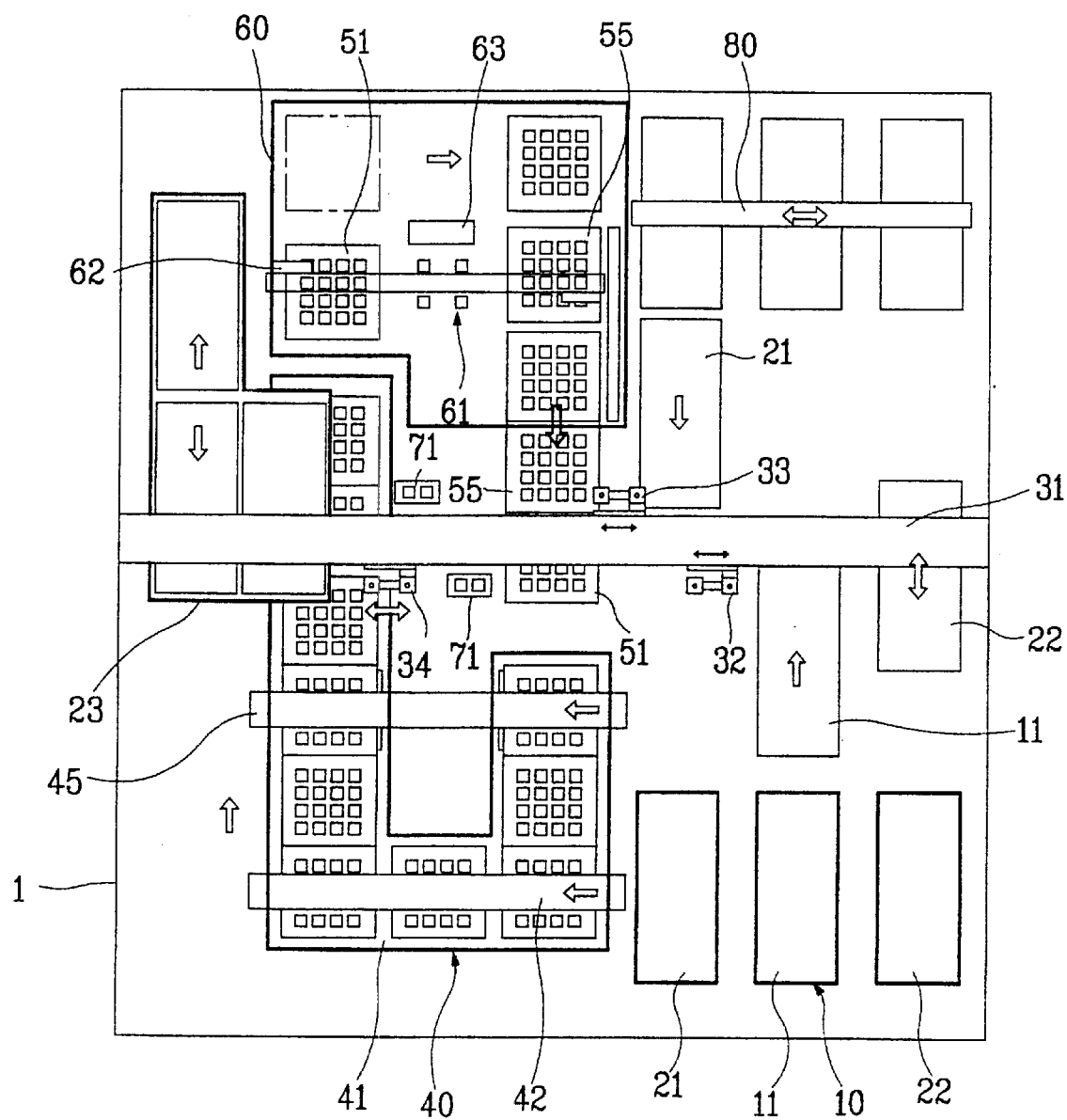
FIG. 1 illustrates a plan view of a device test handler in accordance with a preferred embodiment of the present invention.
Figure 2:
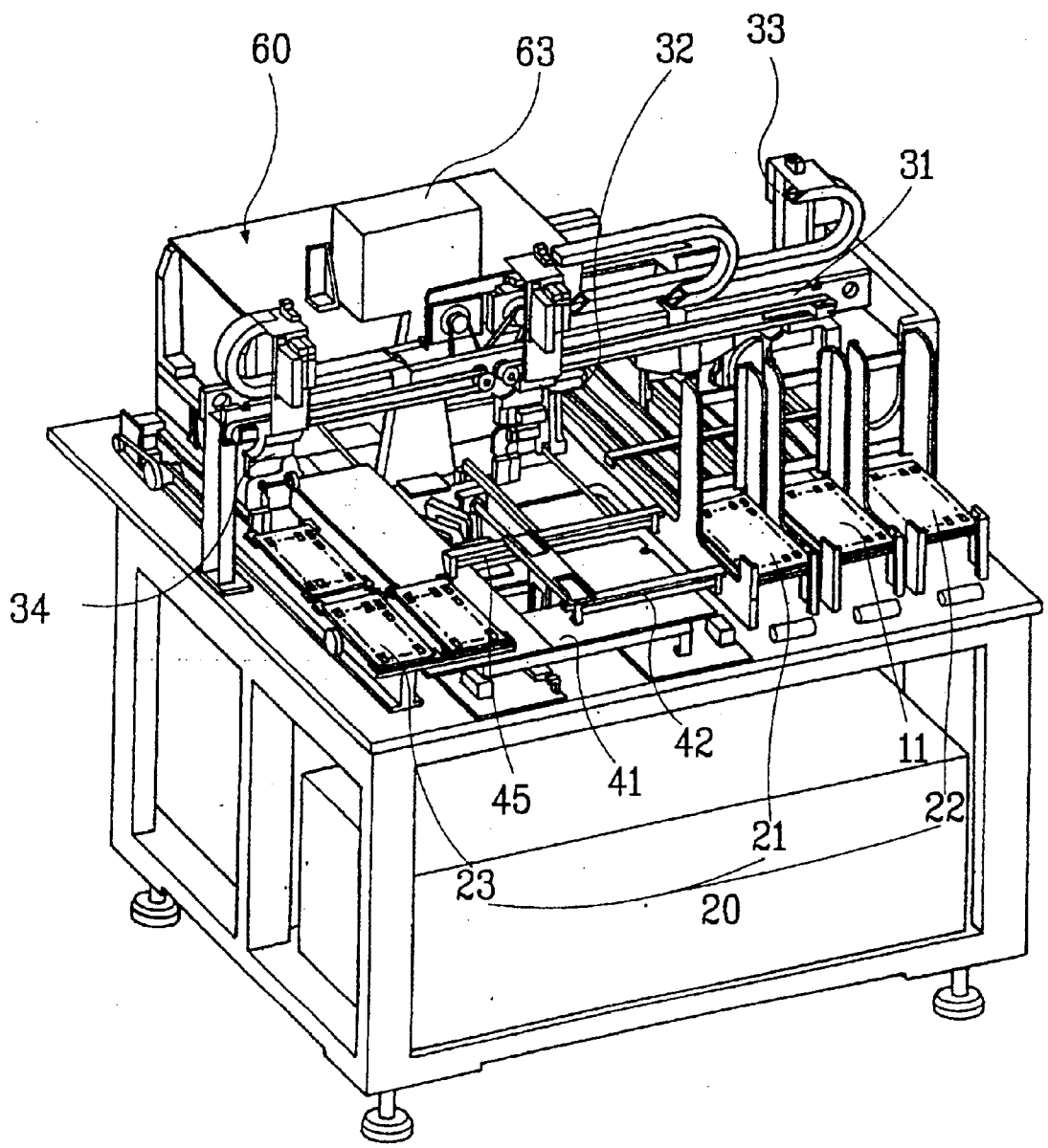
FIG. 2 illustrates a perspective view showing main parts of the device test handler in FIG. 1.

Reference will now be made in detail to the preferred embodiments of the present invention, examples of which are illustrated in the accompanying drawings. FIGS. 1 and 2 illustrate device test handlers in accordance with a preferred embodiment of the present invention.

Referring to FIGS. 1 and 2, there is a loading part 10 on one side of a front portion of a base 1 of the device test handler. A stack of trays 11, having devices to be tested placed therein, are placed on the loading part 10. A stack of trays 21 for holding good devices, classified as a result of testing, are placed on one side of the loading part 10. A stack of trays 22 for holding devices to be re-tested are placed on the other side of the loading part 10. There are also a plurality of trays 23 on the other side of the front portion of the base 1 for holding defective devices according to class of defect degrees.

The trays 21 for holding good devices, the trays 22 for holding devices to be re-tested, and the trays 23 for holding the defective devices comprise an unloading part 20. The trays in the loading part 10 and the unloading part 20 are movable on the base 1 in front and rear directions, as indicated by the arrows in FIG. 1.

A plurality of shuttles, each of which is configured to hold a plurality of logic devices, move around the test handler in a loop. The shuttles transport the logic devices into and out of a test chamber 60. Logic devices to be tested are transferred to a loading shuttle 51 when it is located at a central portion of the base 1, as shown in FIG. 1. The loading shuttle is divided into a plurality of cells for receiving the devices transported from the input tray 11 in the loading part 10.

A guide frame 31 in the middle of the base 1 crosses over the base 1. A loading picker 32, a first unloading picker 33, and a second unloading picker 34 are movably fitted on the frame 31. The loading picker 32 and the second unloading picker 34 are fitted on the same face of the guide frame 31. The range of movements the loading picker 32 and the second unloading picker 34 are not overlapped.

The loading picker 32 transports the devices from the input tray 11 to the loading shuttle 51. The first and second unloading pickers 33 and 34 transport the devices from a shuttle that has left the test chamber 60 onto respective trays 21, 22, and 23 in the unloading part 20.

On the front portion of the base 1 there is a pre-heating part 40 which includes a heating plate 41 for pre-heating the devices on the loading shuttles 51 as the loading shuttles 51 filled with the devices are transported along the pre-heating part 40. A transfer device 42 is used to move the loading shuttles 51 along the heating plate 41. Preferably, the heating plate 41 is operative electrically for easy temperature control. The heating plate 41 in the pre-heating part 40 may extend rearward up to a test chamber 60 in which the devices are tested. The loading shuttle 51 passes through the pre-heating part 40 and inside the test chamber 60.

When no pre-heating of the devices on the loading shuttles 51 is required, a bypass transfer mechanism 45 can be used to move a loading shuttle directly across the pre-heating part 40 and into a path leading to the test chamber. In this instance, the loading shuttle does not travel along all the path of the pre-heating part 40, but rather through a shortened bypass path, thus reducing the test time.

The test chamber 60 is substantially an enclosed space for maintaining an environmental temperature of the devices in a fixed state when the devices are tested. The devices could be tested at a temperature that is elevated or lowered relative to room temperature. In the test chamber 60, there are test sockets 61, each of which is configured to hold and test a logic device. There could be one or a plurality of such test sockets 61 on any given machine embodying the invention. Unloading shuttles 55 are located on one side of the test sockets, each for receiving and holding the devices tested at the test sockets 61. An indexing device is used for successive transferring and loading of devices to be tested from the loading shuttle 51 to the test socket 61, and for transporting the tested devices from the test socket 61 to the unloading shuttle 55. A gas supply duct 63 is used for supplying hot or cool gas to the test socket 61 when the devices are tested in a hot or cold state. The shuttles are movable in the test chamber 60 so that after the devices to be tested are emptied from one of the shuttles, the shuttle can move behind the test sockets, and around to the other side of the test socket to an unloading portion so that the shuttle can then act as an unloading shuttle 55. Once an unloading shuttle 55 has been filled with tested devices, it is moved out of the test chamber 60 to a position of the guide frame 31 in the middle of the base 1.

A buffer part 71, located in front of the test chamber 60, is used for temporary storage of devices classified as being defective. Defective devices are transported from an unloading shuttle 55 to the buffer part 71 by the first unloading picker 33. The buffer part 71 can then move forward to a position aligned with the second unloading picker 34. The second unloading picker 34 can then transfer the defective devices to one of the defective device output trays 23. If there is more than one classification of defective devices, the separate classifications could be stored in different defective output trays.

There is a tray transfer device 80 in a rear portion of the base 1 for distributing empty trays 11 from the loading part 10 in either direction so that the empty trays 11 can be used as the trays 21 for loading good devices and the trays 22 for loading the devices to be re-tested.

The operation of the device test handler in accordance with a preferred embodiment of the present invention will be explained.

When the device test handler is put into operation after the loading part is stacked with trays 11 that contain devices to be tested, a tray 11 from the loading part 10 is transported toward the rear of the base to a position in front of the guide frame 31 in the middle of the base 1. The loading picker 32 on the guide frame 31 transfers the devices from the tray 11 to one or more of loading shuttles 51. Once all the devices have been transferred to loading the shuttle 51, the tray 11 is transferred to the tray transfer 80 device at a rear portion of the base.

The loading shuttle 51, which is now full of the logic devices, is transferred to the heating plate 41 in the pre-heating part 40 or directly over a rear portion of the pre-heating part 40 via the bypass mechanism 45. The loading shuttle 51 is ultimately transported to the test chamber 60 in the rear portion of the base 1. Once the loading shuttle 51 is inside the test chamber 60, the devices in the loading shuttle 51 are loaded into the test sockets 61 continuously by the indexing device in the test chamber 60. The devices are then tested, and the tested devices are loaded on an unloading shuttle 55 positioned opposite to the loading shuttle 51 by the indexing device. Once an unloading shuttle 55 is fully loaded with tested devices, the unloading shuttle 55 is moved out of the test chamber 60 through a front thereof to beneath the guide frame 31.

Then, the first unloading picker 33 on the guide frame 31 transfers the devices from the unloading shuttle 55 to respective trays 21, 22, and 23 according to the classifications assigned to the devices during the testing. The devices determined to be good are loaded on the tray 21 for good devices, and the devices determined to require re-test are loaded on the tray 22 for devices to be re-tested. The devices determined defective are temporarily loaded on the buffer part 71. The buffer part 71 then moves to an opposite side of the guide frame 31, so that it is aligned with the second unloading picker 34. The second unloading picker then transfers the defective devices from the buffer part 71 to the tray 23 for defective devices. Because multiple separate trays for defective devices are available, the defective devices can be classified into different categories. The defective device trays can move backward and forward so that the second unloading picker 34 can load the defective devices into the appropriate defective device tray according to the classification assigned during testing.

Upon completion of testing of all of the devices in the loading part 10, testing of the devices in the tray 22 for devices to be re-tested is carried out automatically. The retest tray 22 in the front portion of the base 1 is moved backward up to a position of the tray transfer device 80, and the tray is shifted to a position aligned with the loading part 10. The tray is then moved forward to a space under the guide frame 31, and is advanced step by step as the devices are transferred to loading shuttles 51 by the loading picker 32. The testing process thereafter is identical to the aforementioned process, and upon completion of unloading and test for all of the devices in the retest tray 22, the process is completed.

Figure 3:
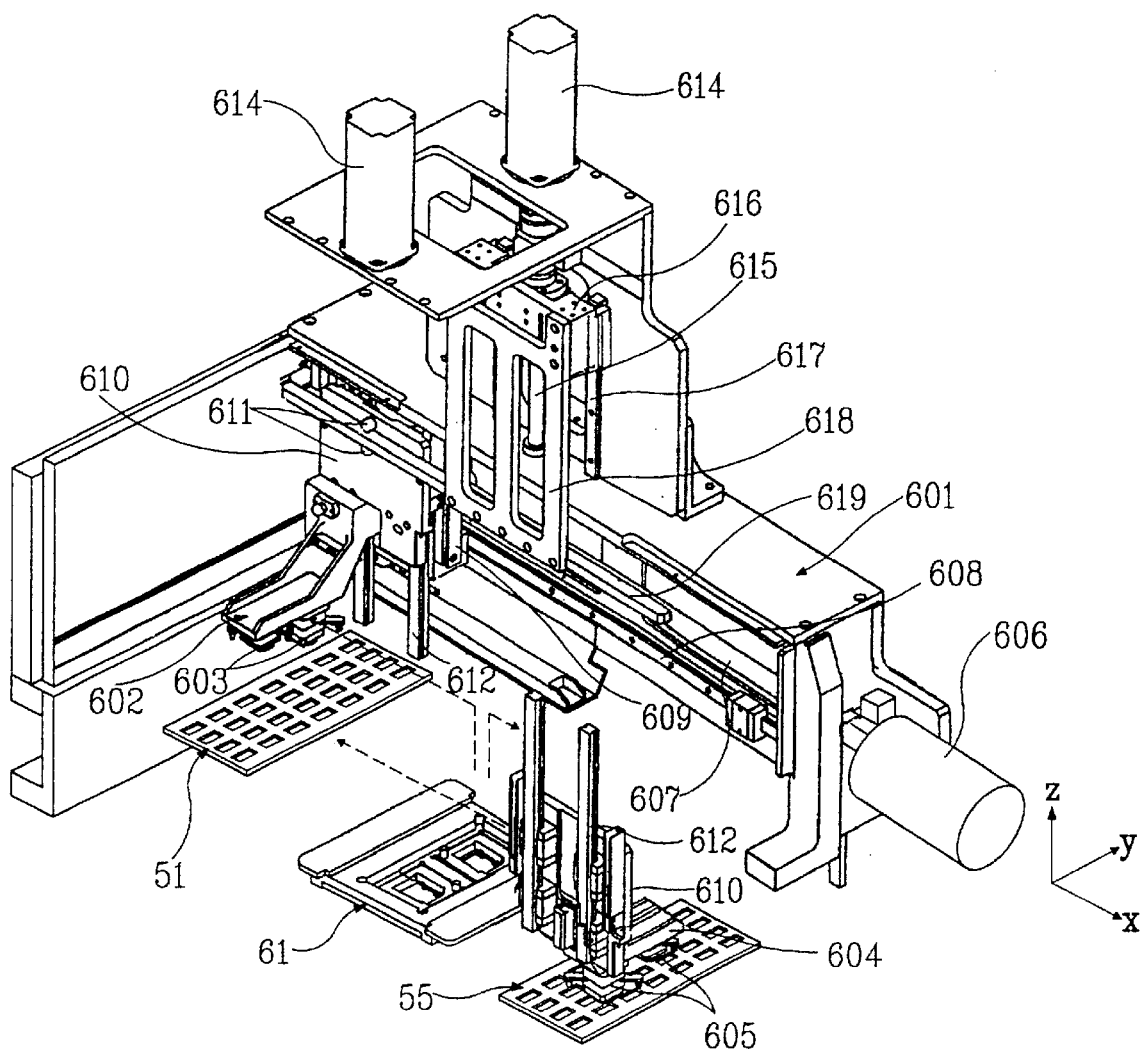
FIG. 3 illustrates a perspective view of an indexing device of the device test handler with a part omitted; and, FIGS. 4A–4D illustrate plan views of the indexing device in FIG. 3 showing a sequence of operation thereof, schematically.

FIG. 3 illustrates a perspective view of an indexing device 62 embodying the invention that can be used in the device test handler. The front, right transferring mechanism that is used to move the second index head 604 has been omitted from FIG. 3 for purposes of clarity.

Referring to FIG. 3, when the loading shuttle 51 enters into the test chamber 60 and is positioned at a test loading position, the loading shuttle 51, the test socket 61, and the unloading shuttle 55 are arranged on a line, with the test socket 61 positioned lower than the loading shuttle 51 and the unloading shuttle 55. The loading shuttle 51 and the unloading shuttle 55 move step by step at fixed intervals as the devices thereon are picked up/placed.

There are a pair of opposing frames 601 located over the test sockets (note: the second frame for holding and moving the second index head 604 has been omitted from FIG. 3). The frames 601 extend in the same direction (hereafter called as 'X-axis direction') in which the loading shuttle 51, the test socket 61 and the unloading shuttle 55 are aligned. A first index head 602 and a second index head 604 are located between the pair of frames 601, and the indexing heads are movable in the X and Y axes. The first and second indexing heads repeat a process of: (1) transferring the devices from the loading shuttle 51 to the test sockets 61; (2) loading the devices into the test sockets; (3) transferring the devices from the test socket 61 to the unloading shuttle 55; and (4) returning back to a position of the loading shuttle 51. The process is described in greater detail below with reference to FIGS. 4A–4D.

Each of the first and second index heads 602 and 604 has one or more device holders 603 and 605. The number of device holders on each index head corresponds to the number of devices that can be simultaneously loaded into the test sockets 61. The device holders 603 or 605 move up and down in the first or second index head 602 or 604, and are designed to hold and release the devices.

There are motors 606 fitted to one side of the frames 601 for driving the first and index heads 602 and 604, individually. There is a threaded driving rod 607 fitted to each of the motors 606 that extends along the X-axis. The driving rod 607 rotates as the motor 606 rotates. A supporting block 609 is thread coupled with the threaded driving rod 607, for moving in an X-axis direction as the threaded driving rod 607 rotates.

There is a supporting plate 610, having the first or second index heads 602 or 604 fitted thereto, coupled with a front portion of the supporting block 609. The first or second index heads 602 or 604 are movable in up and down directions along an LM guide 612 located between the support plate 610 and the index head. An LM guide 608 is coupled with the supporting block 609 for guiding movement of the supporting block 609 in the X direction. When the motor 606 is put into operation, to rotate the threaded rod 607, the supporting block 609 moves along the LM guide 608 in the X-axis direction, together with the supporting plate 610 and the index head.

A vertical motor 614 is also located on a central portion of each of the frames 601 for controlling vertical movement of the first or second index heads 602 or 604. A threaded vertical driving rod 615 is connected to the vertical motor 614. An elevating block 616 is coupled to the vertical driving rod 615 and is movable in up and down directions as the threaded vertical driving rod 615 rotates. An LM guide 617 is used for guiding the up and down movement of the elevating block 616. A vertical plate 618 extends downward from a front portion of the elevating block 616, and an elevating bar 619 is fixed to a lower end of the vertical plate 618 in the X-axis direction. The supporting plate 610 is coupled to the elevating bar 619 with a supporting bearing 611 inbetween, such that the supporting plate can move in both the X-axis direction and the vertical direction following movement of the elevating bar 619. When the vertical motor 614 is put into operation, to rotate the threaded vertical driving rod 615, the elevating block 616 coupled therewith moves along the LM guide 617 in up and down directions, to move the first or second index head 602 or 604 in up and down directions as the supporting plate 610 moves up and down together with the vertical plate 618 and the elevating bar 619 coupled with the elevating block 616.

The operation of the indexing device will be explained with reference to FIGS. 4A–4D.

Figure 4A:
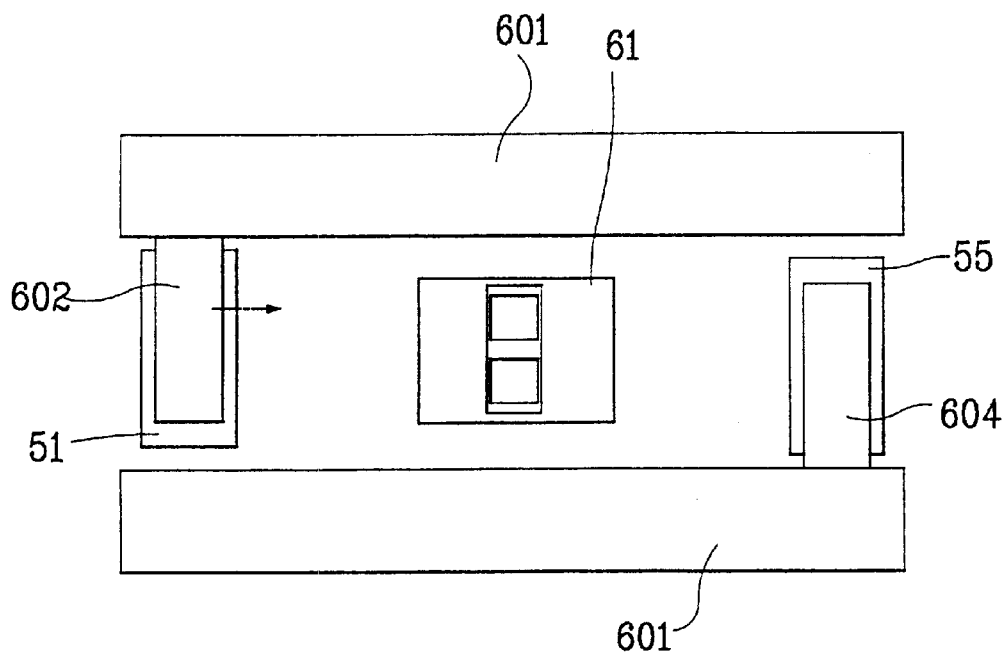
Figure 4B:
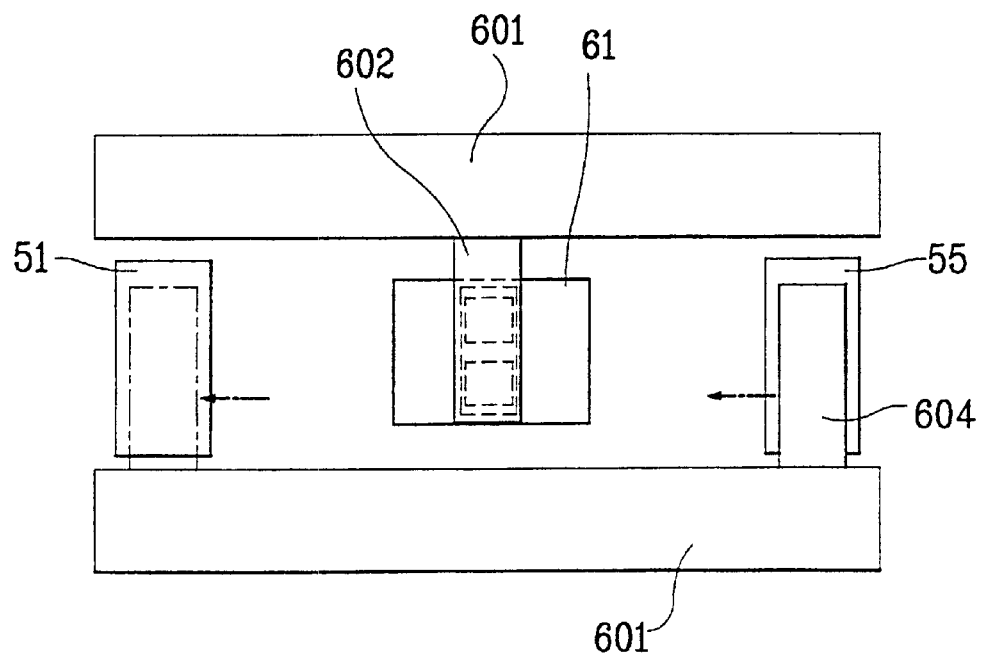

Referring to FIG. 4A, at an initial starting of the device test handler, the first index head 602 is positioned at a test loading position over the loading shuttle 51, and the second index head 604 is positioned at a test unloading position over the unloading shuttle 55, or vice versa. As the motor 614 is driven, the first index head 602 moves down and the device holder 603 grasps one or more of the devices to be tested on the loading shuttle 51. Then, as shown in FIG. 4B, the first index head 602 moves up in the Y-axis, then over to the right in the X-axis direction to a space over the test socket 61 as the vertical and horizontal motors are driven. The device holder 603 then moves down as the vertical motor 614 is driven again, and loads the one or more devices into the test sockets 61, for testing. The second index head 604, which was initially positioned opposite to the first index head 602, moves in the X-axis direction toward the loading shuttle 51, and stops at a test loading position over the loading shuttle 51 as the motor 606 is driven. The second index head 604 then moves down and grasps one or more the devices to be tested, and stands by. The second index head 604 may come to rest at a standby position that is immediately adjacent the test sockets 61, as illustrated by the dashed lines in FIG. 4C. This will allow the second index head to very quickly move into position over the test sockets as soon as the first index head 602 leaves, to minimize index time.

Figure 4C:
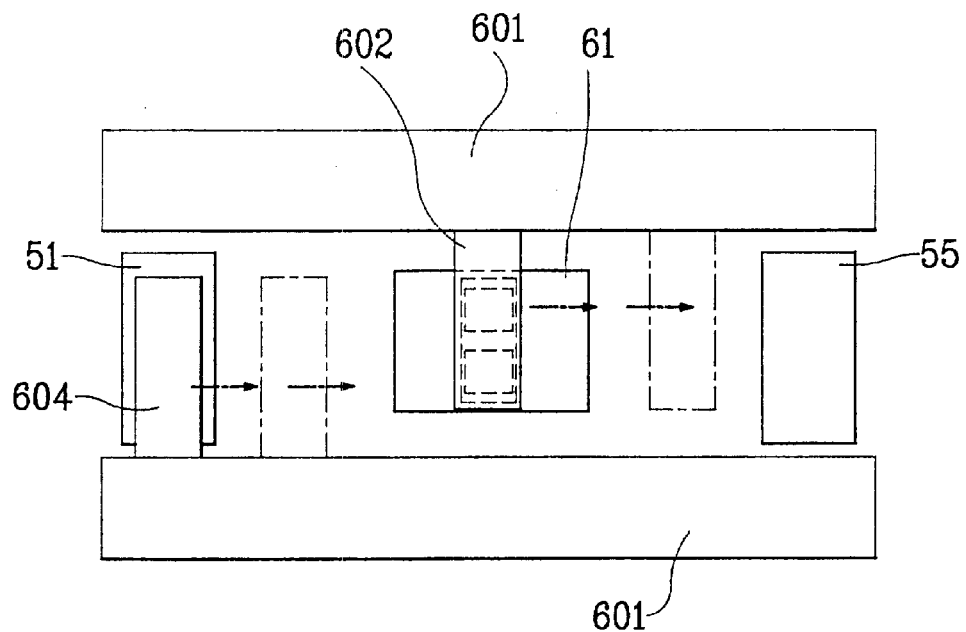
Figure 4D:
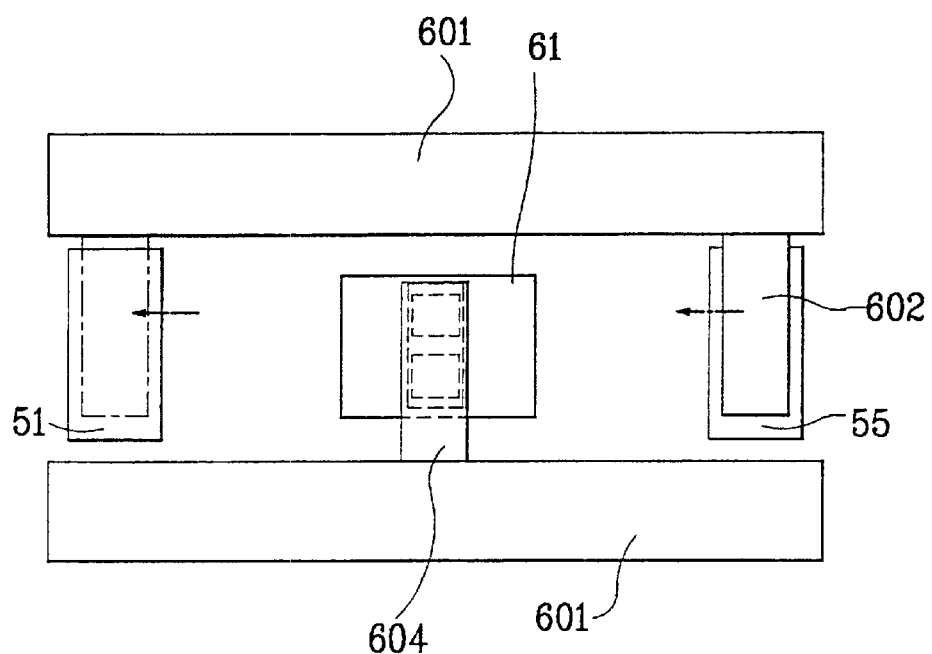

As shown in FIG. 4C, after elapse of a preset time period for the testing, the first index head 602 holds the tested devices and moves up, moves to the test unloading position over the unloading shuttle 55, moves down, and loads the tested devices into the unloading shuttle 55. As soon as the first index head 602 moves away from the test socket 61 toward the unloading shuttle 55, the second index head 604 moves toward the test socket 61, and moves down and loads the devices it is holding into the test sockets 61 for testing. After the first index head 602 drops off the tested devices at the unloading shuttle 55, it returns to the loading shuttle 51 and repeats the foregoing process. FIG. 4D illustrates the second index head 604 positioned over the test socket 61, and the first index head 602 returning from a space over the unloading shuttle 55 to a position of the loading shuttle 51.

Although the second index head 604 and the first index head 602 cross at a position over the test socket 61, because one of the index heads is moved down toward the test socket 61, the index heads do not collide. Using the above process, the first index head 602 and the second index head 604 can load the devices into the test socket 61 continuously, in a manner that minimizes an index time period. During the picking up and placing of the devices by the first and second index heads 602 and 604, the loading shuttle 51 and the unloading shuttle 55 move back and forth in steps, thereby allowing smooth continuous picking up and placing of the devices from/to the shuttles.

As has been explained, the device test handler and the method for operating the same of the present invention significantly reduces the picking up and placing time periods to reduce possible damage to the devices during production, and to reduce an index time period, which maximizes testing efficiency.

The continuous supply of the devices to the test sockets by the two index heads minimizes an index time period, and the one directional transportation of the devices eliminates the need for a separate device picking up and placing device, thereby simplifying the device test handler.

It will be apparent to those skilled in the art that various modifications and variations can be made in the device test handler and the method for operating the same of the present invention without departing from the spirit or scope of the invention. Thus, it is intended that the present invention cover the modifications and variations of this invention provided they come within the scope of the appended claims and their equivalents.

What is claimed is:

1. A device test handler, comprising:
    a loading part configured to supply input trays holding devices to be tested;
    a plurality of shuttles configured to hold devices to be tested;
    a loading picker configured to transport devices from an input tray to a shuttle located at a device loading position;
    a first unloading picker configured to transport devices from a shuttle located at a device unloading position to one of a plurality of output trays;
    a shuttle transfer mechanism configured to move each of the plurality of shuttles between the device loading position, a test loading position, a test unloading position, and the device unloading position;
    a test chamber having at least one testing socket configured to test the devices; and
    an indexing mechanism configured to transport the devices from a shuttle located at the test loading position to the at least one testing socket in the test chamber, and then from the testing socket to a shuttle located at the test unloading position.

2. The device of claim 1, further comprising:
    a temporary storage buffer configured to hold at least one device; and
    a second unloading picker configured to transport a device from the temporary storage buffer to an output tray.

3. The device of claim 2, wherein the temporary storage buffer is configured to move from a first position aligned with the first unloading picker to a second position aligned with the second unloading picker.

4. The device of claim 3, wherein the first position of the storage buffer and the second position of the storage buffer are located at different vertical levels.

5. The device of claim 2, wherein the loading picker is located on a first side of a guide frame that crosses over the test handler, and wherein the first unloading picker is located on a second side of the guide frame.

6. The device of claim 5, wherein the second unloading picker is located on the first side of the guide rail.

7. The device of claim 1, further comprising a pre-heating part configured to preheat devices before they move into the test chamber.

8. The device of claim 7, wherein the pre-heating part comprises a heating plate configured to heat the shuttles, and the devices in the shuttles, as the shuttles move along a pre-heating path between the device loading position and the test chamber.

9. The device of claim 8, further comprising a shuttle bypass transfer mechanism configured to move a shuttle holding devices to be tested along a bypass route that bypasses the pre-heating path.

10. The device of claim 1, further comprising a tray distributing mechanism configured to transfer empty supply trays from the loading part to device output positions at which the trays can receive tested devices unloaded by the first unloading picker.

11. The device of claim 10, wherein the tray distributing mechanism is configured to move trays from the loading part to a good device output position where the trays can receive good devices unloaded by the first unloading picker and to a re-test output position where the trays can receive devices that require re-testing from the first unloading picker.

12. The device of claim 11, wherein the tray transport mechanism is also configured to transport trays from the re-test output position to a position aligned with the loading part.

13. The device of claim 1, wherein the indexing mechanism comprises:
    a first index head configured to transport devices from a shuttle located at the test loading position to the at least one testing socket, and from the at least one testing socket to a shuttle located at the test unloading position;
    a second index head configured to transport devices from a shuttle located at the test loading position to the at least one testing socket, and from the at least one testing socket to a shuttle located at the test unloading position, wherein the indexing mechanism is configured to move the first index head and the second index head in a rotational fashion as the first and second index heads transport devices from the test loading position to the at least one testing socket and from the at least one testing socket to the test output position.

14. The device of claim 13, wherein the at least one testing socket is located at a level below the test loading position and the test unloading position.

15. The device of claim 14, wherein the indexing mechanism is configured to move the first and second index heads such that when one index head is located at the at least one testing socket, the other index head passes over the at least one testing socket as it moves from the test unloading position to the test loading position.

16. The device of claim 13, wherein the test chamber includes a plurality of testing sockets, and wherein the first and second index heads are each configured to simultaneously transport a plurality of devices.

17. The device of claim 13, wherein the indexing mechanism is configured such that after one index head picks up a device and moves to the at least one testing socket, the other index head will pick up a device from the test loading position and move to a standby position immediately adjacent the at least one testing socket.

18. The device of claim 13, wherein the indexing mechanism is configured to move the first index head and the second index head along substantially the same path passing between the test loading position, the at least one testing socket, and the test unloading position.

19. A method for operating a device test handler, comprising:

transporting devices from an input tray to a shuttle located at a device loading position with a loading picker;

moving the shuttle along a test input path passing from the device loading position to a test loading position within a test chamber wherein the test input path includes a pre-heater such that the shuttle and the devices loaded in the shuttle are pre-heated before they arrive at the test loading position when it is necessary to test the devices at an elevated temperature;

transporting the devices from a shuttle located at the test loading position to a testing socket in the test chamber;

testing the devices at the testing socket;

transporting the devices from the testing socket to a shuttle located at a test unloading position;

moving the shuttle from the test unloading position to a device unloading position; and unloading the tested devices to output trays with an unloading picker based on results of the testing step, wherein good devices are unloaded to a good device tray, devices requiring re-testing are unloaded to a re-test tray, and wherein bad devices are unloaded to a bad device tray.

20. The method of claim 19, wherein the step of unloading bad devices comprises:

transporting bad devices from the shuttle to a buffer with a first unloading picker; and transporting the bad devices from the buffer to the bad device tray with a second unloading picker.

21. The method of claim 20, further comprising moving the buffer from a first position aligned with the first unloading picker to a second position aligned with the second unloading picker after the bad devices are transported to the buffer and before the bad devices are transported to the bad device tray.

22. A method of testing a plurality of devices in a testing chamber, comprising:

transporting devices from a shuttle located at a test loading position to a testing socket with a first index head, testing the devices, and transporting the tested devices to a shuttle located at a test unloading position with the first indexing head;

transporting devices from the shuttle located at the test loading position to the testing socket with a second index head, testing the devices, and transporting the tested devices to a shuttle located at the test unloading position with the second index head;

wherein the first index head and the second index head move in a rotational fashion along substantially the same path passing from the test loading position to the testing socket, and from the testing socket to the test unloading position.

23. The method of claim 22, wherein when the first index head is located at the testing socket so that devices can be tested, the second index head:

moves from the test unloading position to the test loading position by passing over the testing socket;

picks up devices from a shuttle located at the test loading position; and moves to a standby position adjacent the testing socket.

24. A device test handler, comprising:

a loading part configured to supply input trays holding devices to be tested;

a plurality of shuttles configured to hold devices to be tested;

a loading picker configured to transport devices from an input tray to a shuttle located at a device loading position;

a first unloading picker configured to transport devices from a shuttle located at a device unloading position to one of a plurality of output trays;

a shuttle transfer mechanism configured to move the plurality of shuttles between the device loading position, a test loading position, a test unloading position, and the device unloading position;

a test chamber having at least one testing socket configured to test the devices;

an indexing mechanism configured to transport the devices from a shuttle located at the test loading position to the at least one testing socket in the test chamber, and then from the testing socket to a shuttle located at the test unloading position; and a tray distributing mechanism configured to transfer empty supply trays from the loading part to device output positions at which the trays can receive tested devices unloaded by the first unloading picker.

25. The device of claim 24, further comprising:

a temporary storage buffer configured to hold at least one device; and a second unloading picker configured to transport a device from the temporary storage buffer to an output tray.

26. The device of claim 24, wherein the indexing mechanism comprises:

a first index head configured to transport devices from a shuttle located at the test loading position to the at least one testing socket, and from the at least one testing socket to a shuttle located at the test unloading position;

a second index head configured to transport devices from a shuttle located at the test loading position to the at least one testing socket, and from the at least one testing socket to a shuttle located at the test unloading position, wherein the indexing mechanism is configured to move the first index head and the second index head in a rotational fashion as the first and second index heads transport devices from the test loading position to the at least one testing socket and from the at least one testing socket to the test unloading position.

27. A device test handler, comprising:

a device transfer assembly configured to transfer devices from an input tray to a shuttle, and to transfer devices from a shuttle to an output tray;

a test chamber having at least one testing socket configured to test the devices;

an indexing mechanism configured to transport the devices from a shuttle to the at least one testing socket in the test chamber, and then from the testing socket to another shuttle, wherein the indexing mechanism comprises:

a first index head configured to transport devices from a shuttle to the at least one testing socket, and from the at least one testing socket to another shuttle; and a second index head configured to transport devices from a shuttle to the at least one testing socket, and from the at least one testing socket to another shuttle, wherein the indexing mechanism is configured to move the first index head and the second index head in a rotational pattern defining a loop as the first and second index heads transport devices.

28. The device test handler of claim 27, further comprising a shuttle transfer mechanism configured to move each of a plurality of shuttles between a device loading position, a test loading position, a test unloading position, and a device unloading position.

29. The device of claim 27, further comprising:

a temporary storage buffer configured to hold at least one device; and an unloading picker configure to transport a device from the temporary storage buffer to an output tray.

30. A device test handler, comprising:

at least one test socket configured to electronically test devices;

a transfer mechanism configured to transport devices from input trays to a test loading position, and from a test unloading position to a device unloading position;

a first index head configured to transfer devices from the test loading position to the at least one test socket, and from the at least one test socket to the test unloading position; and a second index head configured to transfer devices from the test loading position to the at least one test socket, and from the at least one test socket to the test unloading position.

31. The device test handler of claim 30, wherein the first and second index heads are configured to move past one another by alternately moving below and above one another.

32. The device test handler of claim 30, wherein the first and second index heads move in a rotational fashion.

33. The device test handler of claim 30, wherein the transfer mechanism comprises:

a loading picker configured to move devices from an input tray to a shuttle located at a device loading position; and a shuttle transfer mechanism configured to move shuttles from the device loading position to the test loading position.

34. The device test handler of claim 33, wherein the transfer mechanism further comprises an unloading picker configured to move devices from a shuttle located at a device unloading position to an output tray.

35. A method for operating a device test handler, comprising:

transporting devices from an input tray to a shuttle located at a device loading position with a loading picker;

moving the shuttle along a test input path passing from the device loading position to a test loading position within a test chamber;

transporting the devices from a shuttle located at the test loading position to a testing socket in the test chamber;

testing the devices at the testing socket;

moving a shuttle from the test loading position to the test unloading position;

transporting the devices from the testing socket to a shuttle located at a test unloading position;

moving the shuttle from the test unloading position to a device unloading position; and unloading the tested devices to output trays with an unloading picker based on results of the testing step.

* * * * *